(12) United States Patent
Subramanian

(10) Patent No.: US 7,511,356 B2
(45) Date of Patent: Mar. 31, 2009

(54) VOLTAGE-CONTROLLED SEMICONDUCTOR INDUCTOR AND METHOD

(75) Inventor: Krupakar M. Subramanian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 181 days.

(21) Appl. No.: 11/216,644

(22) Filed: Aug. 31, 2005

(65) Prior Publication Data

US 2007/0046412 A1 Mar. 1, 2007

(51) Int. Cl.
  *H01L 27/02* (2006.01)
(52) U.S. Cl. .................. 257/531; 257/516; 257/518; 257/428; 257/533; 257/E27.017; 257/E27.024; 257/E27.049
(58) Field of Classification Search .............. 331/47, 331/52, 177 V, 36 L, 117 FE, 167; 257/E27.049, 257/E29.344, 530, 528, 516, 531, 532, 533, 257/E27.017, E27.024, E29.325, E29.327, 257/E29.336, 233, 545, 312, 480, 601, 595, 257/E29.017; 336/83, 30, 10, 212, 200; 333/174
See application file for complete search history.

(56) References Cited

U.S. PATENT DOCUMENTS

| | | | |
|---|---|---|---|
| 3,614,554 A | 10/1971 | Richardson et al. | |
| 3,988,764 A | 10/1976 | Cline et al. | |
| 4,543,553 A | 9/1985 | Mandai et al. | |
| 4,689,594 A | 8/1987 | Kawabata et al. | |
| 5,095,357 A | 3/1992 | Andoh et al. | |
| 5,227,659 A | 7/1993 | Hubbard | |
| 5,396,101 A | 3/1995 | Shiga | |
| 5,446,311 A | 8/1995 | Ewen et al. | |
| 5,598,136 A | 1/1997 | Kano et al. | |
| 5,767,563 A * | 6/1998 | Imam et al. | ............ 257/531 |
| 6,249,190 B1 * | 6/2001 | Rozenblit et al. | ............ 331/46 |
| 6,249,206 B1 | 6/2001 | Uchikoba et al. | |
| 6,293,001 B1 | 9/2001 | Uriu et al. | |
| 6,437,653 B1 * | 8/2002 | Cruz et al. | ............ 331/181 |
| 6,566,731 B2 | 5/2003 | Ahn et al. | |

OTHER PUBLICATIONS

Hegazi, Emad, et al., "Varactor Characteristics, Oscillator Tuning Curves, and AM-FM Conversion", *IEEE Journal of Solid-State Circuits*, 38(6), (Jun. 2003), 1033-1039.

* cited by examiner

*Primary Examiner*—George Fourson
*Assistant Examiner*—Julio Maldonado
(74) *Attorney, Agent, or Firm*—Schwegman, Lundberg & Woessner, P.A.

(57) ABSTRACT

A voltage-controlled semiconductor inductor and method is provided. According to various embodiments, the voltage-controlled inductor includes a conductor configured with a number of inductive coils. The inductor also includes a semiconductor material having a contact with at least a portion of at least one of the coils. The semiconductor material is doped to form a diode with a first doped region of first conductivity type, a second doped region of second conductivity type, and a depletion region. A voltage across the diode changes lengths of the first doped region, the second doped region and the depletion region, and adjacent coils in contact with at least one of the doped regions are electrically shorted, thereby varying the inductance of the inductor. In various embodiments, the inductor is electrically connected to a resistor and a capacitor to provide a tunable RLC circuit. Other aspects and embodiments are provided herein.

20 Claims, 7 Drawing Sheets

VOLTAGE-CONTROLLED SEMICONDUCTOR INDUCTOR AND METHOD

TECHNICAL FIELD

This disclosure relates to electrical circuits, and more particularly, to variable inductors.

BACKGROUND

Some electronic devices use tuning circuits in their operation. Examples include radio receivers and cellular telephones. Common tuning circuits include RLC (resistor-inductor-capacitor) circuits which use a variable capacitor to "tune" the circuit over a range of frequencies. In these variable-capacitor RLC circuits, the range of frequencies is limited by the range of capacitance over which a variable capacitor may be adjusted.

SUMMARY

The above-mentioned problems and others not expressly discussed herein are addressed by the present subject matter and will be understood by reading and studying this specification.

Disclosed herein, among other things, is a voltage-controlled inductor. According to various embodiments, the inductor includes a conductor configured with a number of inductive coils. The inductor also includes a semiconductor material having a contact with at least a portion of at least one of the coils. The semiconductor material is doped to form a diode with a first doped region of first conductivity type, a second doped region of second conductivity type different from the first conductivity type, and a depletion region. A voltage across the diode changes lengths of the first doped region, the second doped region and the depletion region, and adjacent coils in contact with at least one of the doped regions are electrically shorted, thereby varying the inductance of the inductor.

One aspect of this disclosure relates to an apparatus with a voltage-controlled inductor. According to an embodiment, the apparatus includes a resistor, a capacitor electrically connected to the resistor, and a voltage-controlled variable inductor electrically connected to the resistor and the capacitor, where inductance of the inductor is varied to change the resonant frequency of the apparatus. According to one embodiment, the capacitor includes a variable capacitance. According to various embodiments, the inductor includes a conductor configured with a number of inductive turns, and at least one diode electrically connected with at least a portion of at least one of the turns. A voltage across the at least one diode changes the dimensions of a depletion region, a first doped terminal region and a second doped terminal region, and adjacent turns in contact with at least one of the doped terminal regions are electrically shorted, thereby varying the inductance of the inductor.

According to various embodiments, an apparatus includes a resistor, a capacitor electrically connected to the resistor, and a variable inductor electrically connected to the resistor and the capacitor. The variable inductor includes a conductor configured with a number of inductive coils, and a semiconductor material having an ohmic contact with at least a portion of at least one of the coils. The semiconductor material is doped to form a diode with a first doped region of first conductivity type, a second doped region of second conductivity type different from the first conductivity type, and a depletion region. A voltage across the diode changes lengths of the first doped region, the second doped region and the depletion region, and adjacent coils in contact with at least one of the doped regions are electrically shorted, thereby varying the inductance of the inductor.

One aspect of this disclosure relates to a method of operating a variable inductor with a number of turns and a diode in contact with at least two of the number of turns. According to various embodiments, the method includes applying a first voltage across the diode to provide a length of a depletion region, a first diode terminal region, and a second diode terminal region of the diode to short a first number of turns to provide a first inductance for the variable inductor. The method also includes applying a second voltage across the diode to change the length of the depletion region, the first diode terminal region and the second diode terminal region of the diode to short a second number of turns to provide a second inductance for the variable inductor.

One aspect of this disclosure relates to a method for making a variable inductor. According to various embodiments, the method includes forming a semiconductor material having an ohmic contact with at least a portion of a number of inductor coils. The method also includes doping the semiconductor material to form a diode such that a predetermined voltage applied across the diode electrically shorts a predetermined number of adjacent coils. According to an embodiment, doping the semiconductor material includes forming a plurality of diodes.

This Summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope of the present invention is defined by the appended claims and their legal equivalents.

DETAILED DESCRIPTION

The following detailed description refers to the accompanying drawings which show, by way of illustration, specific aspects and embodiments in which the present invention may be practiced. The various embodiments are not necessarily mutually exclusive, as aspects of one embodiment can be combined with aspects of another embodiment. These embodiments are described in sufficient detail to enable those skilled in the art to practice the invention. Other embodiments may be utilized and structural, logical, and electrical changes may be made without departing from the scope of the present invention.

Some electronic devices use tuning circuits in their operation. Examples include radio receivers and cellular telephones. Common tuning circuits include RLC (resistor-inductor-capacitor) circuits which use a variable capacitor to "tune" the circuit over a range of frequencies. In these variable-capacitor RLC circuits, the range of frequencies is limited by the range of capacitance over which a variable capacitor may be adjusted. Disclosed herein is a variable inductor that can be used with a variable capacitor to increase the range of frequencies for an RLC tuning circuit. The variable inductor provided by the present subject matter is easily adjustable over a range of inductance and is capable of manufacture by common semiconductor fabrication techniques.

Voltage-Controlled Inductor

Figure 1:
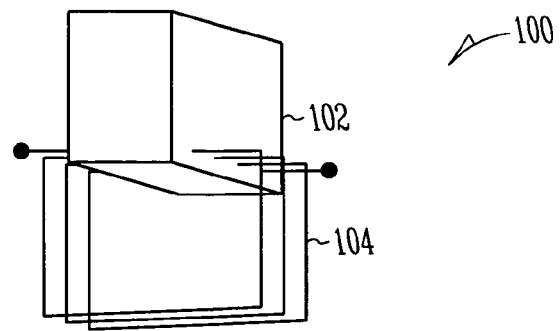
FIG. 1 illustrates an isometric view of a voltage-controlled inductor, according to various embodiments.

FIG. 1 illustrates an isometric view of a voltage-controlled inductor, according to various embodiments. According to an embodiment, the inductor 100 includes a conductor 104 configured with a number of inductive coils. The inductor also includes a semiconductor material 102 having a contact with at least a portion of at least one of the coils. In an embodiment, the semiconductor material has an ohmic contact with at least a portion of at least one of the coils. The semiconductor material can have a Shottky contact with at least a portion of at least one of the coils, in an embodiment. In general two types of contacts are made to a semiconductor, the ohmic contact and the Shottky or rectifying contact. An ohmic contact refers to a metal-semiconductor contact with very low resistance independent of applied voltage. To form an ohmic contact, the metal and semiconductor are selected such that there is no potential barrier formed at the interface (or potential barrier is so thin that charge carriers can readily tunnel through it). A Shottky contact refers to a metal-semiconductor contact displaying asymmetric current-voltage characteristics, allowing high current to flow across under the forward bias condition and blocking current under the reverse bias. This behavior is controlled by the bias voltage dependent changes of the potential barrier height in the contact region. The work function of the conductor and the semiconductor determine whether a contact on the semiconductor will have ohmic or rectifying properties. Various embodiments of the present disclosure use the properties of the ohmic contact, by doping the semiconductor to an appropriate level, although Shottky contacts may also be used.

Figure 2A:
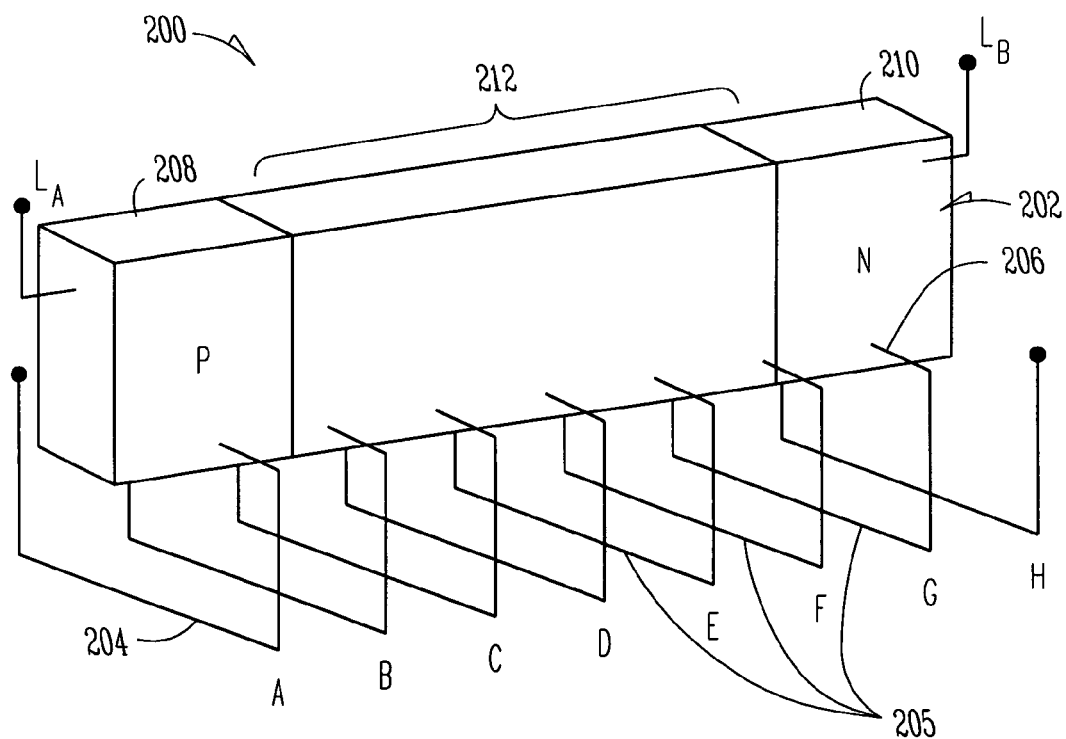
FIG. 2A illustrates a side view of a voltage-controlled inductor, according to various embodiments.

FIG. 2A illustrates a side view of a voltage-controlled inductor, according to various embodiments. According to an embodiment, the inductor 200 includes a conductor 204 configured with a number of inductive coils 205. The inductor also includes a semiconductor material 202 having an ohmic contact 206 with at least a portion of at least one of the coils, where the semiconductor material is doped to form a diode with a first doped region of first conductivity type 208, a second doped region of second conductivity type different from the first conductivity type 210, and a depletion region 212. A voltage across the diode changes lengths of the first doped region, the second doped region and the depletion region, and adjacent coils in contact with at least one of the doped regions are electrically shorted, thereby varying the inductance of the inductor. A single coil or turn begins at a contact point with the diode and ends at an adjacent contact point with the diode. As the reverse bias is varied across the diode, the depletion region size increases or decreases. Since the depletion region is substantially equivalent to an insulator due to the lack of carriers, the coils or turns passing through the depletion region remain isolated. However, coils or turns passing through the first doped region (p-doped region in FIG. 2A) or the second doped region (n-doped region in FIG. 2A) of the diode will be shorted because of the availability of carriers. In FIG. 2A, coils A, B, G, and H are outside the depletion region and electrically shorted, while coils C, D, E, and F are in contact with the depletion region and remain part of the inductor. In an embodiment, the apparatus further includes a magnetic core within the coils.

Figure 2B:
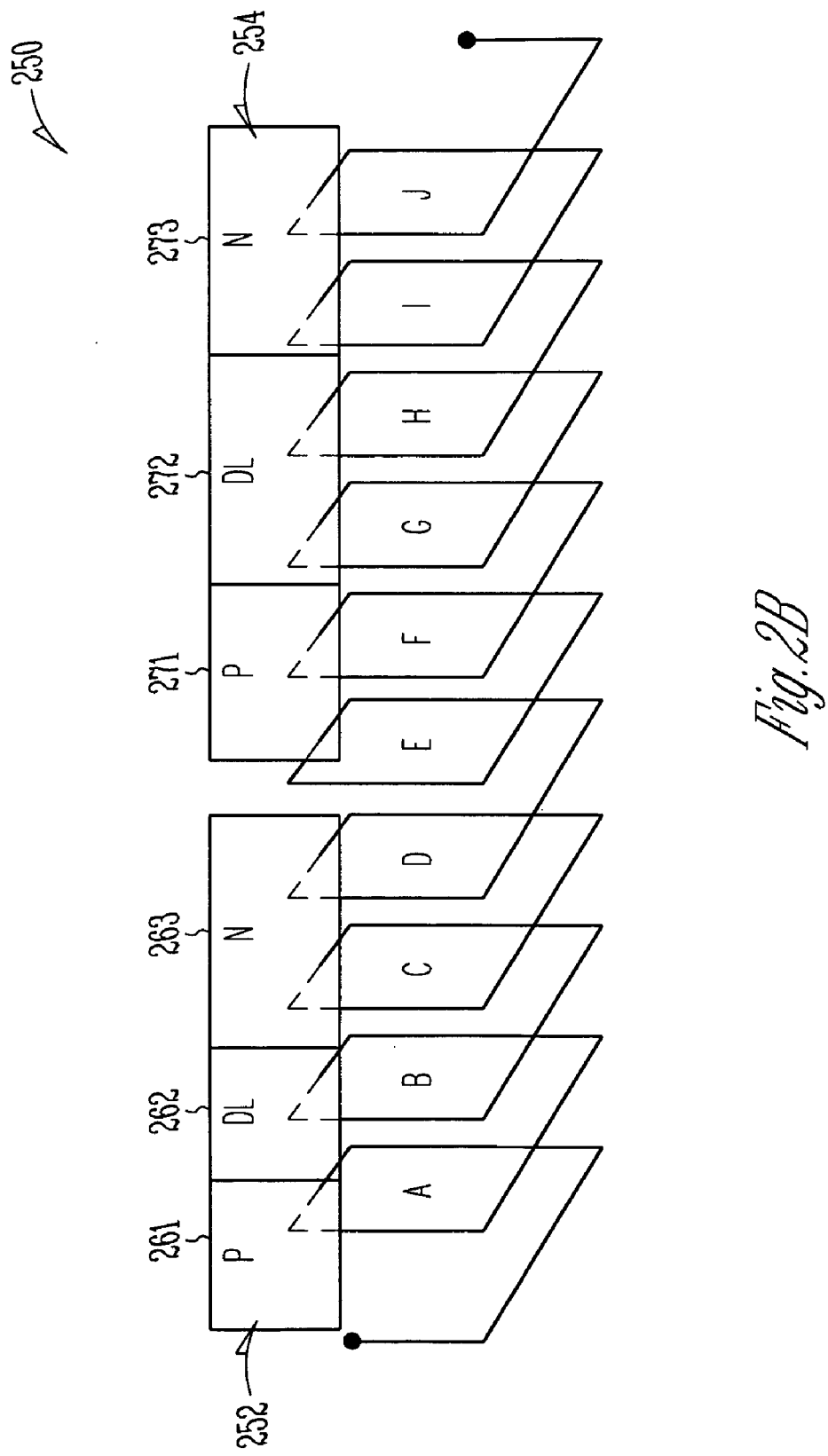
FIG. 2B illustrates a voltage-controlled inductor with multiple diodes, according to various embodiments.

FIG. 2B illustrates a voltage-controlled inductor 250 with multiple diodes, according to various embodiments. In applications requiring large variations in voltage-controlled inductance, several diodes may be used to short or isolate various turns in a single long inductor. In FIG. 2B, two diodes, 252 and 254, are used to vary the inductance of inductor 250. The first diode 252 has a p-doped region 261, an n-doped region 263, and a depletion region 262 under reverse bias. The second diode 254 has a p-doped region 271, an n-doped region 273, and a depletion region 272 under reverse bias. In the depicted embodiment, turns B, G, and H remain part of the inductor as they are in contact with a depletion region. In an embodiment, three diodes are used. In another embodiment, four diodes are used. In a further embodiment, N diodes are used. Those of skill in the art will recognize that further embodiments with more diodes are within the scope of this disclosure. In various embodiments, each of the diodes is adapted to have an ohmic contact with at least a portion of at least one of the coils.

Figure 3:
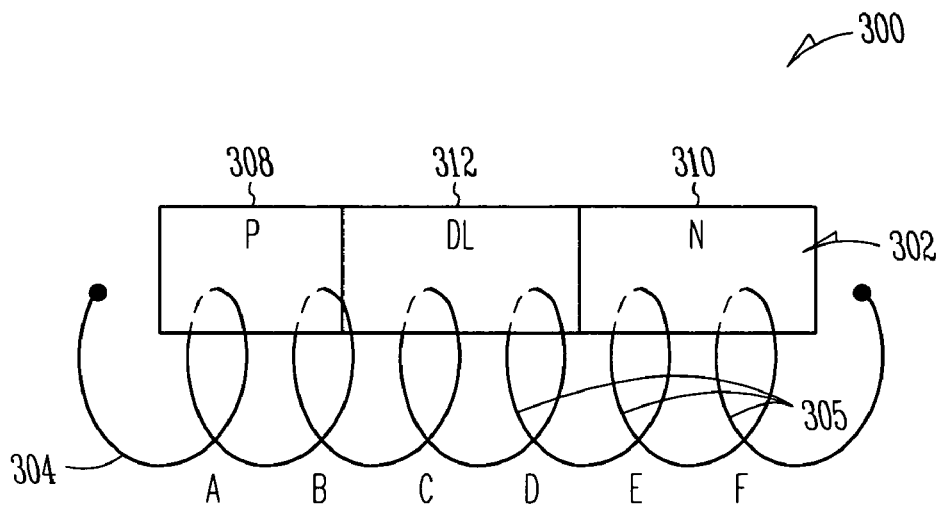
FIG. 3 illustrates a voltage-controlled inductor with helical turns, according to various embodiments.

FIG. 3 illustrates a voltage-controlled inductor with helical turns, according to various embodiments. According to an embodiment, the inductor 300 includes a conductor 304 configured with a number of helical inductive coils 305. The inductor also includes a semiconductor material 302 having an ohmic contact with at least a portion of at least one of the coils, where the semiconductor material is doped to form a diode with a first diode terminal region 308, a second diode terminal region 310 and a depletion region 312. A voltage across the diode changes the dimensions of the first terminal region, the second terminal region and the depletion region, and adjacent coils in contact with at least one of the terminal regions are electrically shorted, thereby varying the inductance of the inductor. A single coil begins at a contact point with the diode and ends at an adjacent contact point with the diode. As the reverse bias is varied across the diode, the depletion region size would increase or decrease. In FIG. 3, coils A, B, E, and F are outside the depletion region and electrically shorted, while coils C and D are in contact with the depletion region and remain part of the inductor.

Figure 4:
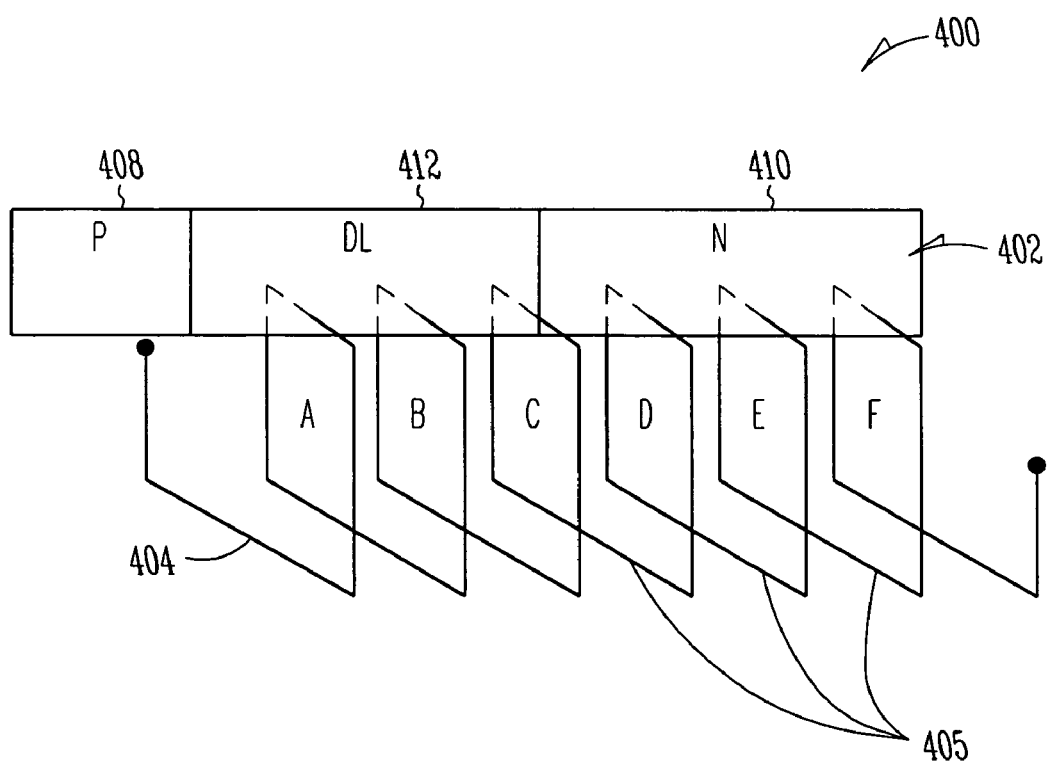
FIG. 4 illustrates a variable inductor, according to various embodiments.

FIG. 4 illustrates a variable inductor, according to various embodiments. According to an embodiment, the inductor 400 includes a conductor 404 configured with a number of inductive turns 405. The inductor also includes a semiconductor material 402 having an ohmic contact with at least a portion of at least one of the turns, where the semiconductor material is doped to form a diode with a first doped region having a first conductivity type 408, a second doped region having a second conductivity type different from the first conductivity type 410, and a depletion region 412. A voltage across the diode changes the dimensions of the first doped region, the second doped region and the depletion region, and adjacent coils in contact with at least one of the doped regions are electrically shorted, thereby varying the inductance of the inductor. A single turn begins at a contact point with the diode and ends at an adjacent contact point with the diode. As the reverse bias is varied across the diode, the depletion region size would increase or decrease. In FIG. 4, coils C, D, E, and F are outside the depletion region and electrically shorted, while coils A and B are in contact with the depletion region and remain part of the inductor. The depicted embodiment has inductor turns contacting only the n-doped region and depletion region. No turns are contacting the p-doped region.

Figure 5:
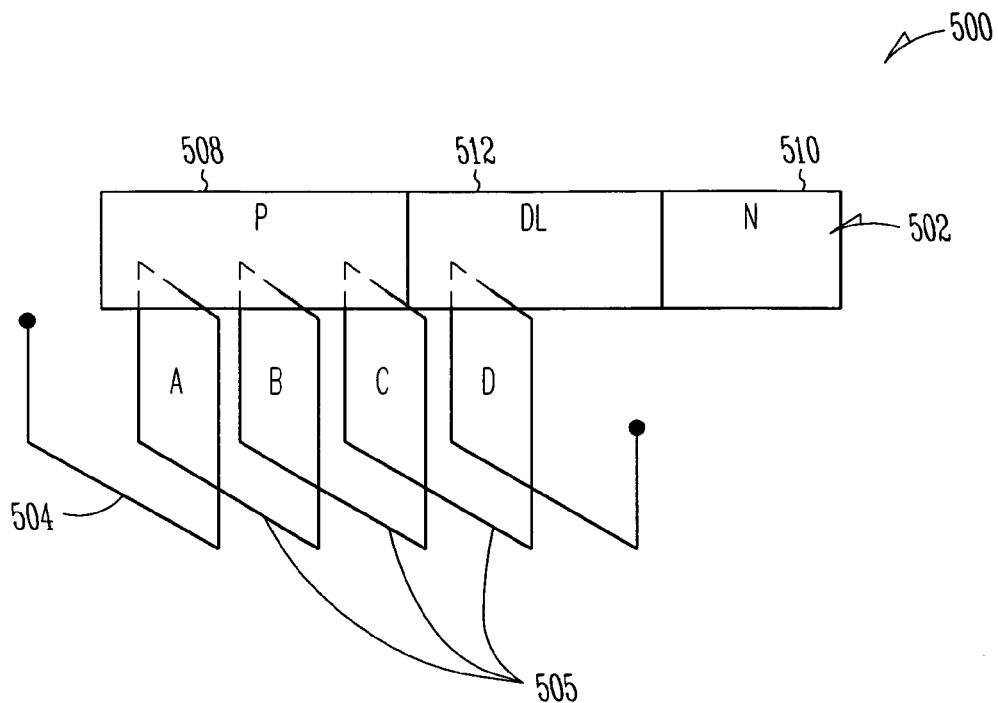
FIG. 5 illustrates a voltage-controlled inductor, according to various embodiments.

FIG. 5 illustrates a voltage-controlled inductor, according to various embodiments. According to an embodiment, the inductor 500 includes a conductor 504 configured with a number of inductive turns 505. The inductor also includes a semiconductor material 502 having an ohmic contact with at least a portion of at least one of the turns, where the semiconductor material is doped to form a diode with a first doped region of first conductivity type 508, a second doped region of second conductivity type different from the first conductivity type 510, and a depletion region 512. A voltage across the diode changes the dimensions of the first doped region, the second doped region and the depletion region, and adjacent coils in contact with at least one of the doped regions are electrically shorted, thereby varying the inductance of the inductor. A single turn begins at a contact point with the diode and ends at an adjacent contact point with the diode. As the reverse bias is varied across the diode, the depletion region size would increase or decrease. In FIG. 5, coils A, B, and C are outside the depletion region and electrically shorted, while coil D is in contact with the depletion region and remains part of the inductor. The depicted embodiment has inductor turns contacting only the p-doped region, and depletion region. No turns are contacting the n-doped region.

Method of Operating a Variable Inductor

Figure 6:
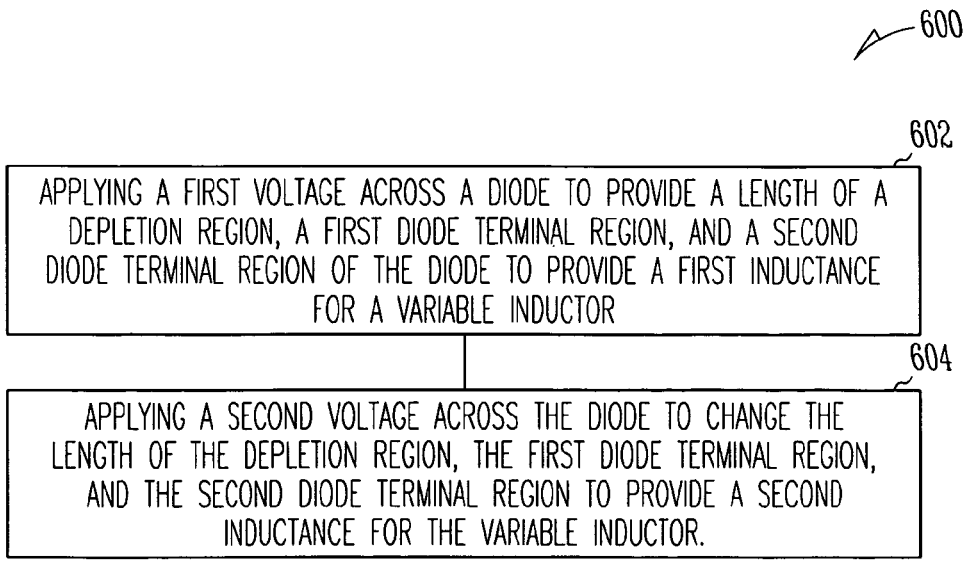
FIG. 6 illustrates a flow diagram of a method of operating a variable inductor, according to various embodiments.

FIG. 6 illustrates a flow diagram of a method of operating a variable inductor, according to various embodiments. One aspect of this disclosure relates to method 600 of operating a variable inductor with a number of turns and a diode in contact with at least a portion of at least one of the number of turns. According to various embodiments, the method includes applying a first voltage across the diode to provide a length of a depletion region, a first diode terminal region, and a second diode terminal region of the diode to short a first number of turns to provide a first inductance for the variable inductor, at 602. The method also includes applying a second voltage across the diode to change the length of the depletion region, the first diode terminal region and the second diode terminal region of the diode to short a second number of turns to provide a second inductance for the variable inductor, at 604.

The total number of turns that may be shorted is controlled by varying the reverse bias voltage. As a result of this interplay of connection and isolation of several turns within an inductor, the overall inductance of a device can be varied. This variation in inductance is in discrete steps, with the step size being the inductance generated by a single turn.

According to an embodiment, applying the first voltage electrically shorts zero adjacent turns to provide a first inductance for the variable inductor. Applying the second voltage electrically shorts zero adjacent turns to provide a second inductance for the variable inductor, according to an embodiment. In one embodiment, applying the second voltage provides the second number of turns less than the first number of turns. Applying the second voltage provides the second number of turns equal to the first number of turns, in an embodiment.

Method for Making a Variable Inductor

Figure 7:
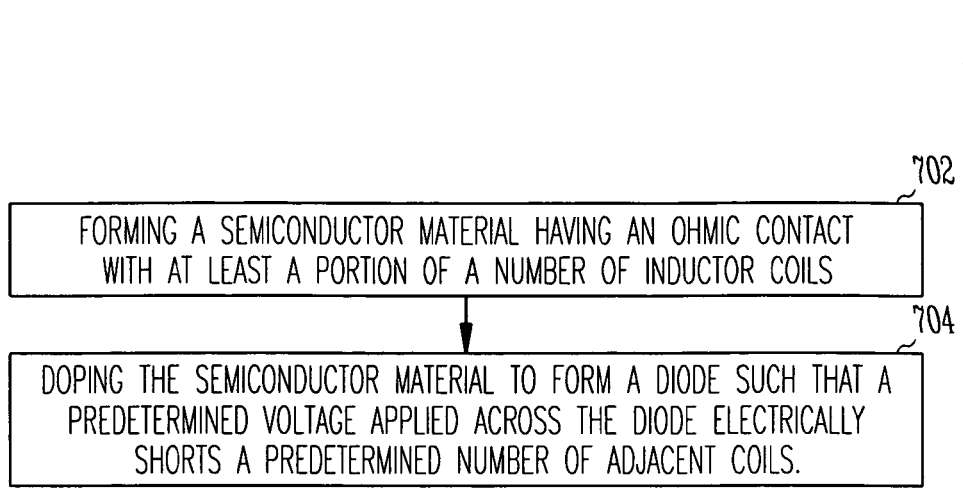
FIG. 7 illustrates a flow diagram of a method for making a variable inductor, according to various embodiments.

FIG. 7 illustrates a flow diagram of a method for making a variable inductor, according to various embodiments. According to various embodiments, the method 700 includes forming a semiconductor material having an ohmic contact with at least a portion of a number of inductor coils, at 702. The method also includes doping the semiconductor material to form a diode such that such that a predetermined voltage applied across the diode electrically shorts a predetermined number of adjacent coils, at 704. According to an embodiment, doping the semiconductor material includes forming a plurality of diodes. In an embodiment, lower doping levels are used to enable wider depletion regions at lower reverse bias voltage levels. In various embodiments, doping levels of $1e^{15}$ to $1e^{18}$ per $cm^3$ are used, with or without doping gradients that can be generated using implantation.

According to various embodiments, applying a reverse bias voltage across the diode increases a dimension of a depletion region of the diode and increases the number of inductor coils in contact with the depletion region, thereby varying the inductance of the inductor. Applying a voltage across the diode changes a dimension of a p-doped region of the diode and changes the number of inductor coils in contact with the p-doped region, thereby varying the inductance of the inductor in an embodiment. According to an embodiment, applying a voltage across the diode changes a dimension of an n-doped region of the diode and changes the number of inductor coils in contact with the n-doped region, thereby varying the inductance of the inductor.

Figure 8A:
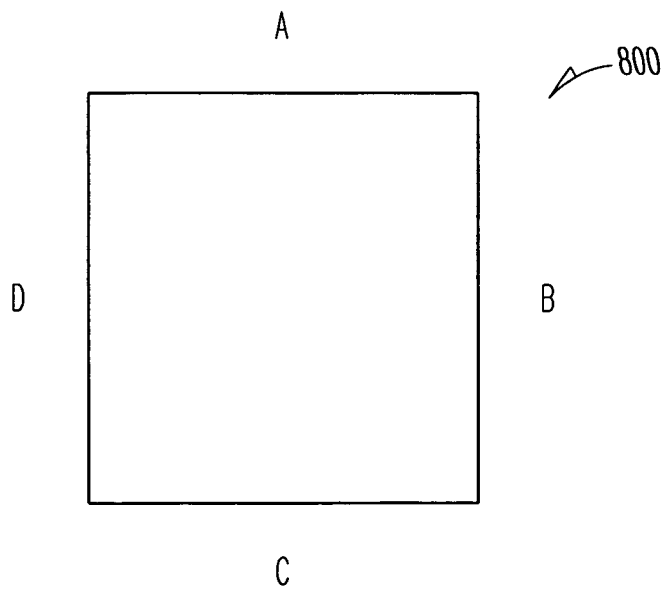
FIGS. 8A-8F illustrate a series of diagrams depicting a method for making a variable inductor, according to various embodiments.

FIGS. 8A-8F illustrate a series of diagrams depicting a method for making a variable inductor, according to various embodiments. Ohmic contact material is used to build inductor coils, and square shaped coils are used in the variable inductor in the depicted embodiment. FIG. 8A illustrates a single square shaped coil 800 with sides (or wires) labeled A, B, C, and D. One of skill in the art will recognize that other conductor shapes, such as helical or elongated coils for example, can be used with the semiconductor diode to provide a voltage-controlled inductor.

Figure 8B:
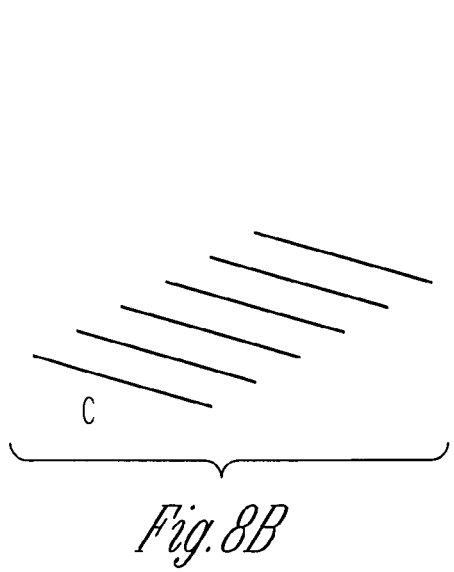
Figure 8C:
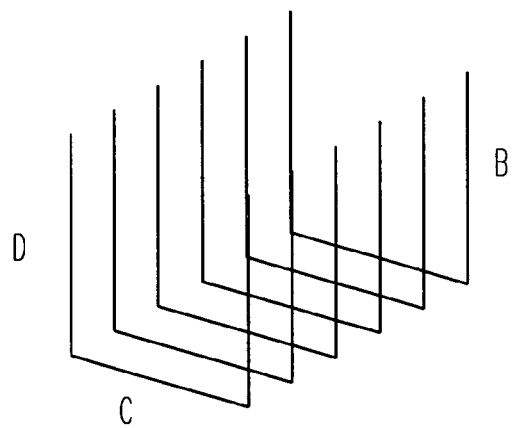
Figure 8D:
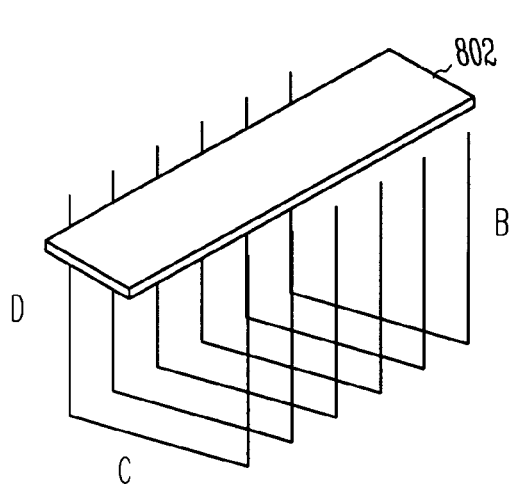
Figure 8E:
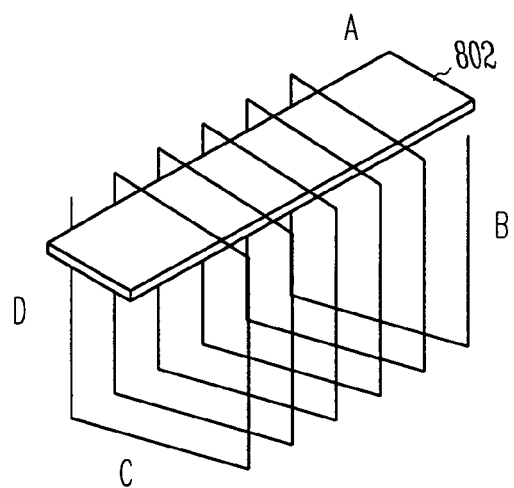
Figure 8F:
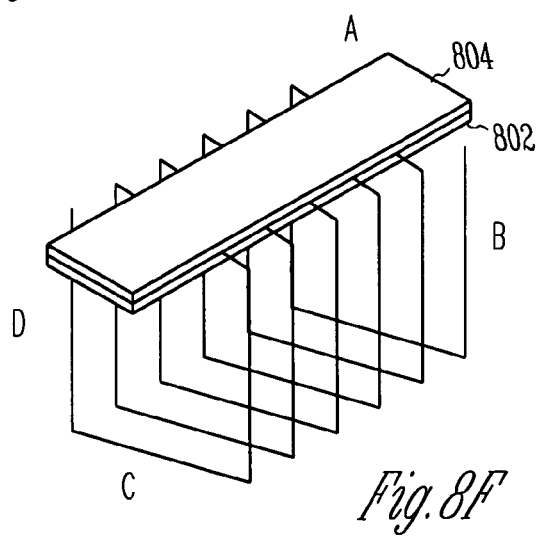

According to various embodiments, steps for making a variable inductor include laying down on a substrate the side of the coil labeled C as shown in FIG. 8B. The illustrated C lines are generally parallel to each other and horizontal with respect to the substrate. In FIG. 8C, wires labeled B and D are subsequently deposited on the substrate. The illustrated B and D lines are generally parallel to each other and vertical with respect to the substrate. In FIG. 8D, a trench feature is etched in the substrate to deposit a semiconductor material 802. In various embodiments, the depth of the trench is such that the wires are completely immersed in the semiconductor material. In an embodiment, the depth of the trench is several times the thickness of the inductor wire's diameter. In FIG. 8E, the connecting wires labeled A are laid on top of the semiconductor material in an embodiment. Subsequently in FIG. 8F, additional semiconductor material 804 is laid over the previously deposited material 802. The wires A are effectively sandwiched between two layers of semiconductor material in this embodiment. Finally, appropriate doping is performed to convert the semiconductor material into a p-n or n-p diode, in various embodiments.

According to an embodiment, the method for making a variable inductor includes forming a series of lower conductors of equal length on a substrate using ohmic contact forming material, each of the lower conductors parallel to one another and having a first end and a second end. The method also includes forming a series of first upright conductors and a series of second upright conductors in the substrate vertically from the series of lower conductors using ohmic contact forming material. The first upright conductors have a lower end and an upper end, the lower end connecting to first end of the lower conductors, and the second upright conductors having a lower end and an upper end, the lower end connecting to the second end of the lower conductors at right angles to the lower conductors. The method further includes etching a trench in the substrate. The trench has a depth greater than a thickness of the connecting conductor but less than a length of the upright conductors, and a width less than a length of the lower conductors. A first layer of semiconductor material is deposited to fill in the trench. According to an embodiment, the method also includes forming a series of connecting conductors along the top of the semiconductor material. Each of the connecting conductors is parallel to each other, with one end of each connecting conductor contacting the upper end of a first upright conductor, and further contacting the upper end of a second upright conductor whose lower end is connected to an adjacent lower conductor. The method also includes depositing a second layer of semiconductor material upon the first layer of semiconductor material to sandwich the series of connecting conductors, and doping the first and second layer of semiconductor material to form a diode perpendicular to the series of connecting conductors.

According to various embodiments, the diode can be formed on the bottom of the coils. The diode can be formed on a side of the coils, in an embodiment. Other methods of making the variable inductor are within the scope of this disclosure.

Applications Using a Variable Inductor

The present apparatus has a number of potential applications. The following examples, while not exhaustive, are illustrative of these applications.

An RLC circuit is a kind of electrical circuit composed of a resistor (R), an inductor (L), and a capacitor (C). A voltage source (V) is also implied. It is called a second-order circuit or second-order filter as any voltage or current in the circuit is the solution to a second-order differential equation. The RLC circuit is an example of an electrical harmonic oscillator. The resonant or center frequency of such a circuit (in hertz) is:

$$f_c = 1/2\pi\sqrt{(LC)}$$

It is a form of bandpass or bandcut filter, and the Q factor is:

$$Q = f_c/BW = 2\pi f_c/R = 1/\sqrt{(R^2 C/L)}$$

Figure 9A:
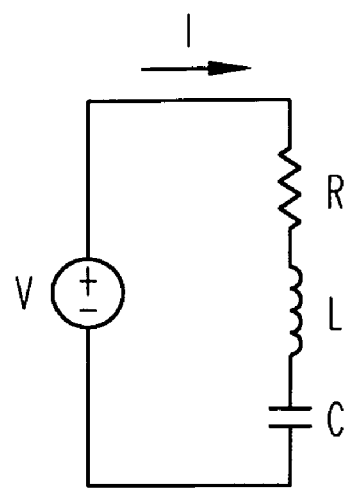
FIG. 9A illustrates a series RLC circuit using a voltage-controlled inductor, according to various embodiments.
Figure 9B:
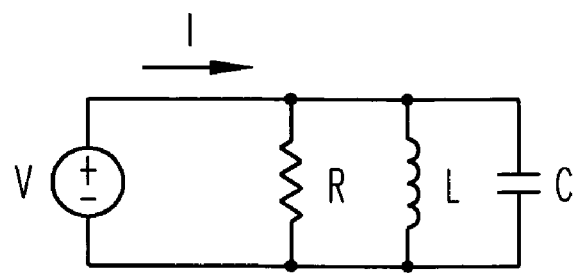
FIG. 9B illustrates a parallel RLC circuit using a voltage-controlled inductor, according to various embodiments.

There are two common configurations of RLC circuits: series (shown in FIG. 9A) and parallel (shown in FIG. 9B).

FIG. 9A illustrates a series RLC circuit using a voltage-controlled inductor, according to various embodiments. One aspect of this disclosure relates to an apparatus with a voltage-controlled inductor. According to an embodiment, the apparatus includes a resistor R, a capacitor C electrically connected to the resistor, and a voltage-controlled variable inductor L electrically connected to the resistor and the capacitor, where inductance of the inductor is varied to change the resonant frequency of the apparatus. According to various embodiments, the variable inductor L includes inductors described in FIGS. 1-5 described above. According to one embodiment, the capacitor C includes a variable capacitor.

FIG. 9B illustrates a parallel RLC circuit using a voltage-controlled inductor, according to various embodiments. One aspect of this disclosure relates to an apparatus with a voltage-controlled inductor. According to an embodiment, the apparatus includes a resistor R, a capacitor C electrically connected to the resistor, and a voltage-controlled variable inductor L electrically connected to the resistor and the capacitor, where inductance of the inductor is varied to change the resonant frequency of the apparatus. According to various embodiments, the variable inductor L includes inductors described in FIGS. 1-5 above. According to one embodiment, the capacitor C includes a variable capacitance.

In an electrical circuit, resonance occurs at a particular frequency when the inductive reactance and the capacitive reactance are of equal magnitude, causing electrical energy to oscillate between the magnetic field of the inductor and the electrical field of the capacitor. Resonance occurs because the collapsing magnetic field of the inductor generates an electric current in its windings that charges the capacitor, and the discharging capacitor provides an electric current that builds the magnetic field in the inductor, and the process is repeated. An analogy is a mechanical pendulum. At resonance, the series impedance of the two elements is at a minimum and the parallel impedance is at a maximum. Resonance is used for tuning and filtering, because resonance occurs at a particular frequency for given values of capacitance and inductance.

An example of an RLC circuit is a radio tuner. The antenna of the radio picks up radio signals from every station in the area, but only the station whose frequency matches the natural (resonant) frequency of the tuning circuit will cause large currents to flow in the circuit. These currents, when amplified, are the ones that produce the sound heard by a listener. If the circuit is not properly tuned, then it may pick up two stations equally well.

In various embodiments of the apparatus described in FIGS. 9A and 9B, the resistor, capacitor and variable inductor are adapted for tuning a cellular telephone receiver. In other embodiments, the resistor, capacitor and variable inductor are adapted for tuning a radio receiver. In further embodiments, the resistor, capacitor and variable inductor are adapted for tuning a satellite receiver. In various embodiments, the apparatus described is adapted for use in timing for memory circuits, to adjust a high frequency response.

FIGS. 9A and 9B are examples of RLC circuits. More complex circuits can have resistors, capacitors and variable inductors and have a resonant frequency. Other applications for variable inductors include use in high speed global interconnect circuit designs, which provide on-chip transmission lines for global signaling at the velocity of light. Such circuits require precise inductances and will not properly operate if mismatched. In an embodiment, the disclosed variable inductor provides a convenient way of ensuring matching components in the described high speed global interconnect circuits.

Further applications for variable inductors include use in matching circuits for radio frequency (RF) plasma processing tools. Matching circuits utilizing the disclosed variable inductor can provide more rapid matching compared to conventional stepper motor controlled matching circuits. Such quick response matching circuits are well suited for plasma-enhanced atomic layer deposition (PEALD) processes, where plasma is cycled on and off frequently.

This disclosure includes several processes, diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiment shown. This application is intended to cover adaptations or variations, and includes any other applications in which the above structures and fabrication methods are used. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. An apparatus, comprising:
   a resistor;
   a capacitor electrically connected to the resistor; and
   a voltage-controlled variable inductor electrically connected to the resistor and the capacitor, the inductor including:
      a conductor configured with a number of inductive turns; and
      at least one diode electrically connected with at least a portion of at least one of the turns;
   wherein inductance of the inductor is varied to change the resonant frequency of the apparatus.

2. The apparatus of claim 1, wherein the capacitor includes a variable capacitance.

3. The apparatus of claim 1, wherein a voltage across the at least one diode changes lengths of a depletion region, a first doped terminal region and a second doped terminal region, and wherein adjacent turns in contact with at least one of the doped terminal regions are electrically shorted, thereby varying the inductance of the inductor.

4. The apparatus of claim 1, wherein the resistor, capacitor and variable inductor are adapted for tuning a cellular telephone receiver.

5. The apparatus of claim 1, wherein the resistor, capacitor and variable inductor are adapted for tuning a radio receiver.

6. An apparatus, comprising:
   a resistor;
   a capacitor electrically connected to the resistor; and
   a variable inductor electrically connected to the resistor and the capacitor, the variable inductor including:
      a conductor configured with a number of inductive coils; and
      a semiconductor material having an ohmic contact with at least a portion of at least one of the coils;
   wherein the semiconductor material is doped to form a diode with a first doped region of first conductivity type, a second doped region of second conductivity type different from the first conductivity type, and a depletion region, wherein a voltage across the diode changes lengths of the first doped region, the second doped region and the depletion region, and wherein adjacent coils in contact with at least one of the doped regions are electrically shorted, thereby varying the inductance of the inductor.

7. The apparatus of claim 6, wherein the capacitor includes a variable capacitance.

8. The apparatus of claim 6, wherein the resistor, capacitor and variable inductor are adapted for tuning a cellular telephone receiver.

9. The apparatus of claim 6, wherein the resistor, capacitor and variable inductor are adapted for tuning a radio receiver.

10. The apparatus of claim 6, wherein the resistor, capacitor and variable inductor are adapted for tuning a satellite receiver.

11. An apparatus, comprising:
    a resistor;
    a capacitor electrically connected to the resistor;
    a voltage-controlled variable inductor electrically connected to the resistor and the capacitor;
    wherein inductance of the inductor is varied to change the resonant frequency of the apparatus; and
    wherein the inductor includes at least one semiconductor material including at least one diode.

12. The apparatus of claim 11, wherein the capacitor includes a variable capacitance.

13. The apparatus of claim 11, wherein the inductor includes a helical coil having an ohmic contact with the semiconductor material.

14. The apparatus of claim 11, wherein the inductor includes a square coil having an ohmic contact with the semiconductor material.

15. The apparatus of claim 11, wherein the inductor includes an irregularly-shaped coil having an ohmic contact with the semiconductor material.

16. An apparatus, comprising:
    a resistor;
    a capacitor electrically connected to the resistor; and
    a variable inductor electrically connected to the resistor and the capacitor, the variable inductor including:
       a conductor configured with a number of helical inductive coils; and
       a semiconductor material having an ohmic contact with at least a portion of at least one of the coils;
    wherein the semiconductor material is doped to form a diode with a first doped region of first conductivity type, a second doped region of second conductivity type different from the first conductivity type, and a depletion region, wherein a voltage across the diode changes lengths of the first doped region, the second doped region and the depletion region, and wherein adjacent coils in contact with at least one of the doped regions are electrically shorted, thereby varying the inductance of the inductor.

17. The apparatus of claim 16, wherein the capacitor includes a variable capacitance.

18. The apparatus of claim 16, wherein the semiconductor material is doped to form a plurality of diodes.

19. The apparatus of claim 16, wherein the inductor, the resistor and the capacitor provide a tunable RLC circuit.

20. The apparatus of claim 19, wherein tunable RLC circuit is adapted for tuning a wireless receiver.

* * * * *